(12) United States Patent
Nelson

(10) Patent No.: US 7,560,736 B2
(45) Date of Patent: Jul. 14, 2009

(54) MID-INFRARED RESONANT CAVITY LIGHT EMITTING DIODES

(75) Inventor: Audrey Nelson, Goleta, CA (US)

(73) Assignee: General Electric Company, Schenectady, NY (US)

( * ) Notice: Subject to any disclaimer, the term of this patent is extended or adjusted under 35 U.S.C. 154(b) by 455 days.

(21) Appl. No.: 11/203,398

(22) Filed: Aug. 15, 2005

(65) Prior Publication Data

US 2007/0034852 A1     Feb. 15, 2007

(51) Int. Cl.
*H01L 27/15* (2006.01)

(52) U.S. Cl. .............................. 257/79; 257/83; 257/25; 257/14; 257/E33.069

(58) Field of Classification Search ................... 257/79, 257/103, 83, 25, 14, E33.069; 372/43
See application file for complete search history.

(56) References Cited

U.S. PATENT DOCUMENTS

| | | | | |
|---|---|---|---|---|
| 5,625,635 | A * | 4/1997 | Kurtz et al. | 372/45.011 |
| 5,763,906 | A * | 6/1998 | Kane et al. | 257/79 |
| 5,995,529 | A | 11/1999 | Kurtz et al. | |
| 6,969,874 | B1 * | 11/2005 | Gee et al. | 257/98 |
| 7,061,022 | B1 * | 6/2006 | Pham et al. | 257/79 |
| 2005/0127352 | A1 * | 6/2005 | Lambkin et al. | 257/14 |
| 2005/0286593 | A1 * | 12/2005 | Guenter | 372/50.21 |
| 2006/0002444 | A1 * | 1/2006 | Wang et al. | 372/50.1 |

FOREIGN PATENT DOCUMENTS

EP     0608674 A1    8/1994

OTHER PUBLICATIONS

N.E.J. Hunt, et al.: "Enhanced spectral power density and reduced linewidth in 1.3 μm in an InGaAsP quantum well resonant-cavity light-emitting diode", Applied Physics Letters, Nov. 9, 1992, pp. 2287-2289, vol. 61, No. 19; American Institute of Physics, Melville, NY.
E. Hadji, et al.: "Resonant Cavity Light Emitting Diodes For The 3-5 μm Range"; Solid-State Electronics, 1996, pp. 473-476, vol. 40, Nos. 1-8; Elsevier Science Ltd. Publishers, Great Britain.
Toshihiro Kato, et al.: "Resonant cavity light emitting diodes with two single quantum wells of different widths"; Journal of Applied Physics, Mar. 1, 2001, pp. 2907-2910, vol. 89, No. 5; American Institute of Physics, New York.
N.E.J. Hunt, et al.: "Extremely Narrow Spectral Widths From Resonant Cavity Light-Emitting Diodes (RCLEDs) Suitable for Wavelength-Division Multiplexing at 1.3 μm and 1.55 μm"; IEEE, Dec. 13, 1992, pp. 651-654; New York, NY.

* cited by examiner

*Primary Examiner*—Tifney L Skyles
(74) *Attorney, Agent, or Firm*—Baker & Hostetler LLP

(57) ABSTRACT

A Resonant Cavity Light Emitting Diode (RCLED) device having a first active region having one or more quantum wells disposed within, a first chamber and a second chamber coupled to the first active region and a first reflector and a second reflector coupled to the first and second chambers respectively is disclosed. The RCLED can be optimized to emit radiation in the carbon-dioxide absorption band.

26 Claims, 7 Drawing Sheets

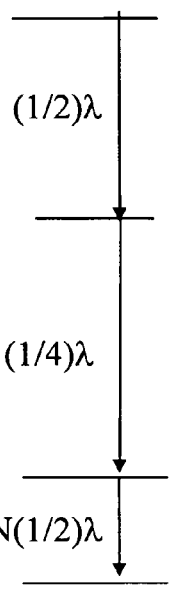

| | LAYER COMPOSITION | THICKESS |
|---|---|---|
| 1 | Electrode * | |
| 2 | $n^+$-InAs ($1\times10^{19}$ cm$^{-3}$) | 318 nm |
| 3 | Undoped InAs | 220 nm |
| 4 | InAs$_{0.89}$Sb$_{0.11}$ | 20 nm |
| 5 | Undoped InAs | 40 nm |
| 6 | InAs$_{0.89}$Sb$_{0.11}$ | 20 nm |
| 7 | Undoped InAs | 40 nm |
| 8 | InAs$_{0.89}$Sb$_{0.11}$ | 20 nm |
| 9 | Undoped InAs | 50 nm |
| 10 | $p^+$-In$_{0.83}$Al$_{0.17}$As | 18 nm |
| 11 | $p^+$-InAs ($1\times10^{19}$ cm$^{-3}$) | 100 nm |
| 12 | $n^+$-InAs ($1\times10^{19}$ cm$^{-3}$) | 66 nm |
| 13 | DBR Pairs (n+InAs/p+GaSb) | (304nm / 273nm) (4920 nm total for 8.5 pairs) |
| 14 | InAs Substrate | |
| 15 | Electrode | |

SAMPLE STRUCTURE FOR RCLED
(LIGHT EMITTED FROM TOP)

FIG. 2

\* Note: Reflector is inherent between air/semiconductor interface.

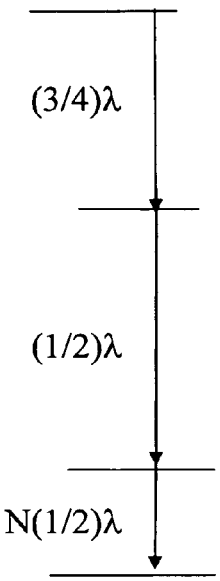

| | LAYER | THICKESS |
|---|---|---|
| 1 | Metal (Gold) | |
| 2 | $n^+$-InAs ($1\times10^{19}$ cm$^{-3}$) | 603 nm |
| 3 | Undoped InAs | 240 nm |
| 4 | InAs$_{0.89}$Sb$_{0.11}$ | 20 nm |
| 5 | Undoped InAs | 40 nm |
| 6 | InAs$_{0.89}$Sb$_{0.11}$ | 20 nm |
| 7 | Undoped InAs | 40 nm |
| 8 | InAs$_{0.89}$Sb$_{0.11}$ | 20 nm |
| 9 | Undoped InAs | 60 nm |
| 10 | $p^+$-In$_{0.83}$Al$_{0.17}$As | 18 nm |
| 11 | $p^+$-InAs ($1\times10^{19}$ cm$^{-3}$) | 240 nm |
| 12 | $n^+$-InAs ($1\times10^{19}$ cm$^{-3}$) | 220 nm |
| 13 | DBR Pairs (N) (n+InAs/p+GaSb) | (304nm / 273nm) (4920 nm total for 8.5 pairs) |
| 14 | InAs Substrate (Polished End) | <100 nm |
| 15 | Air / Electrode | |

**SECOND SAMPLE STRUCTURE FOR RCLED
(LIGHT EMITTED FROM BACKSIDE)**

FIG. 4

| | LAYER | THICKESS | |
|---|---|---|---|
| 1 | Reflector / Electrode (Gold) | | |
| 2 | $p^+$-InAs ($1 \times 10^{19}$ cm$^{-3}$) | 176 nm | |
| 3 | $p^+$-In$_{0.83}$Al$_{0.17}$As | 18 nm | |
| 4 | Undoped InAs | 50 nm | $(1/4)\lambda$ |
| 5 | InAs$_{0.89}$Sb$_{0.11}$ | 20 nm | |
| 6 | Undoped InAs | 30 nm | |
| 7 | InAs$_{0.89}$Sb$_{0.11}$ | 20 nm | |
| 8 | Undoped InAs | 30 nm | |
| 9 | InAs$_{0.89}$Sb$_{0.11}$ | 20 nm | $(1/4)\lambda$ |
| 10 | Undoped InAs | 100 nm | |
| 11 | $n^+$-InAs ($1 \times 10^{19}$ cm$^{-3}$) | 144 nm | |
| 12 | DBR Pairs (n+InAs/p+GaSb) | (304nm / 273nm) (4920 nm total for 8.5 pairs) | $N(\tfrac{1}{2})\lambda$ |
| 13 | InAs Substrate (Polished End) | <100 nm | |
| 14 | Air / Electrode | | |

**THIRD SAMPLE STRUCTURE FOR RCLED
(LIGHT EMITTED FROM BACKSIDE)**

FIG. 5

MID-INFRARED RESONANT CAVITY LIGHT EMITTING DIODES

FIELD OF THE INVENTION

The present invention relates to new resonant cavity light emitting diodes (RCLEDs) with a particular application to mid-range infrared devices.

BACKGROUND OF THE INVENTION

Infrared detection is an optical approach that uses one or more infrared sources in combination with one or more detectors. When measuring concentrations of a particular gas in an atmosphere, the principle is simple: the more gas between a source and detector, the more infrared energy, i.e., light, is absorbed, and thus the transmitted radiation measured by the sensor decreases. Use of the infrared spectrum is often the preferred way to measure gas concentrations in various media, such as atmosphere, blood and various other fluids.

Carbon dioxide has a particularly pronounced absorption peak at 4.26 microns, and thus it can be one of the easier gases to measure in theory. Unfortunately, conventional infrared sources designed to monitor the carbon dioxide peak (by emitted a signal at 4.26 microns) suffer from a variety of problems. For example, the peak wavelength output of IR LEDs often tend to drift with different current levels and variations in temperature. Further, conventional devices rarely, if ever, emit a infrared energy having a profile comparable to the carbon dioxide absorption peak, thus reducing the sensitivity of a detection system. Accordingly, new technology related to infrared sources is desirable.

SUMMARY OF THE INVENTION

In a first embodiment, a Resonant Cavity Light Emitting Diode (RCLED) device capable of emitting radiation having a peak-like profile with a central wavelength ($\lambda$) includes a first active region having a planar form with a top side and bottom side and one or more quantum wells disposed within, wherein the one or more quantum wells are configured to provide energy to stimulate radiation output the RCLED and are located about an anti-node position for a resonant wave of the RCLED, a first chamber adjacent to the top side of the first active region, wherein the first chamber has a thickness such that it extends a first distance from the middle of the first active region and a second chamber adjacent to the bottom side of the first active region, wherein the first active region, the first chamber and the second chamber are configured to cause the RCLED to produce electromagnetic radiation with a center wavelength in the infrared region, and wherein the total thickness of the first active region, the first chamber and the second chamber is about or less than $2\lambda$.

In a second embodiment, a Resonant Cavity Light Emitting Diode (RCLED) device capable of emitting radiation having a peak-like profile with a central wavelength ($\lambda$) includes a first active region having one or more quantum wells disposed within, a first chamber and second chamber coupled to the first active region and first and second reflectors coupled to the first and second chambers respectively, wherein the primary resonant path of radiation within the RCLED is about or less than $2.5\lambda$.

In a third sense, a method is described for operating in a Resonant Cavity Light Emitting Diode (RCLED) device having a first active region having one or more quantum wells disposed within, a first chamber and a second chamber coupled to the first active region and a first reflector and a second reflector coupled to the first and second chambers respectively. The method includes converting electric energy to emit electromagnetic energy into the RCLED using the quantum wells, generating a resonant electromagnetic signal having a notched profile with a central wavelength of $\lambda$ within the RCLED using the emitted electromagnetic energy, wherein the resonant signal is generated using a primary resonant path that includes the first active region, the first chamber and the second chamber, and wherein the primary resonant path is of no more that $3\lambda$, and passing a portion of the electromagnetic energy beyond either the first or second reflector.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIG. 2 depicts an exemplary sequence of layers within the RCLED device of FIG. 1.

FIG. 4 depicts a first exemplary sequence of layers within the RCLED device of FIG. 3.

FIG. 5 depicts a second exemplary sequence of layers within the RCLED device of FIG. 3.

DETAILED DESCRIPTION

Figure 1:
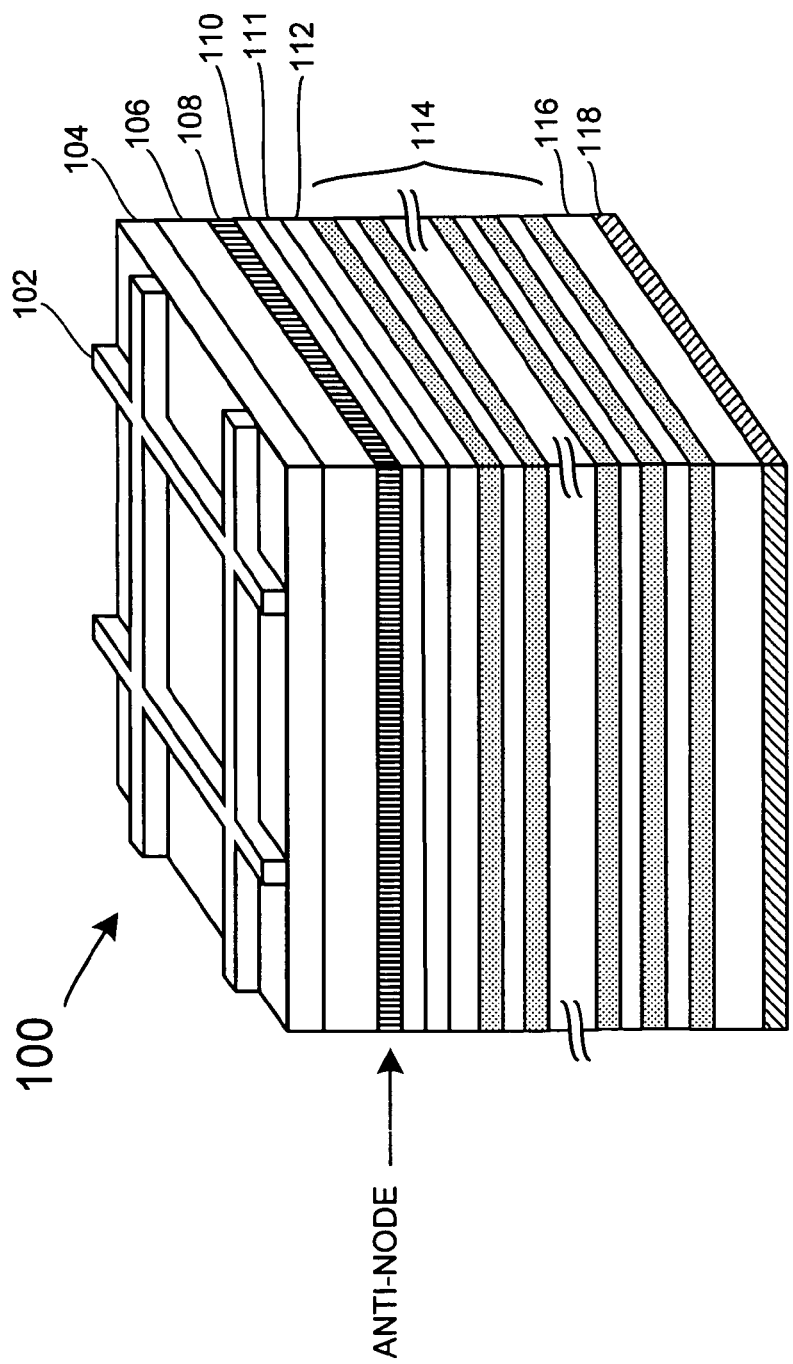
FIG. 1 is a first exemplary RCLED device.

The invention will now be described with reference to the drawing figures, in which like reference numerals refer to like parts throughout. Various embodiments in accordance with the present invention can provide Resonant Cavity Light Emitting Diodes (RCLEDs) that are economical to produce and highly stable. When RCLEDs are appropriately configured to produce a central wavelength of 4.26 microns with an appropriate quality factor ranging from about 14 to 24, such RCLEDs can be extremely useful for use with carbon dioxide detectors capable of measuring even small changes of carbon dioxide concentration in an atmosphere or other fluid.

Generally, the RCLED devices described in the following text derive advantage from at least two aspects: their structure and the materials used. The details of structural advantages are described in more detail below. What may be less apparent upon initial review are the advantages and disadvantages of using Indium Arsenide (InAs) as a primary material. Several advantages of InAs include its high electrical conductivity and transmission of infrared light. While InAs also can be problematic in that it has a narrow band-gap (leading to a variety of prospective problems) the inventor of the disclosed devices and methods has provided a number of solutions to overcome such problems to date left unsolved in the relevant industry.

FIG. 1 is a first exemplary RCLED device 100 according to the disclosed methods and systems. As shown in FIG. 1, the device 100 includes a plethora of layers/regions 102-118 starting from a top electrode 102 having a window 122.

The particular structure of the top electrode 102 is attributable for RCLED devices where output energy is emitted from the top of the device 100. While a mesh-type structure is depicted, it should be appreciated that other electrodes can be used, such as electrodes with different-shaped windows, conductors having a transparent or translucent quality and so on. Note that the mesh-type structure of electrode 102 is not drawn to scale, but increased in size relative to the rest of the RCLED device for clarity of relationship. It should be appreciated that any mesh-like structure should allow most of the electromagnetic energy to escape the device through the holes in the mesh at the interface between air and layer 104.

For reasons explained below, it can be desirable to provide a reflector at the electrode 102, or more precisely at the junction of layers 102 and 104. While the underside of layer 102 can provide limited reflection within the RCLED device 100, reflection can be primarily derived not by any metal reflector but by virtue of the semiconductor materials themselves. For example, generally a reflector may be inherent in an InAs/Air interface given the difference in their respective refractive index coefficients. While the reflection coefficient of such an air/semiconductor reflector (~30%) may not be as high as a gold reflector (~98%) for the infrared wavelengths of immediate interest, there can be various embodiments where a lower reflection is desirable, plus the absence of a gold reflector represents a lower cost of production.

In other embodiments, a metal reflector such as gold is placed at the interface of layer 104 and air, which reflects ~98% of the electromagnetic energy back into the device. In these embodiments (discussed below), the bottom DBR reflector can be made more transparent, and the electromagnetic energy can escape the device 100 through the bottom face.

Directly beneath the top electrode 102 are two contiguous layers 104 and 106 that form a "first chamber". Generally, layers 104 and 106 will be of the same material, such as InAs, but layer 104, referred to as a "current spreading layer" can be heavily doped with various impurities to allow for an appropriate electrical interface to the top electrode 102, i.e., to prevent the formation of a parasitic diode and to reduce resistance. Additionally, the doping of layer 104 can provide a source of free electrons to help make the RCLED device 100 work more efficiently, dissipate less power. and help make surface emission more uniform and brighter.

Directly below layer 106 is what can be referred to as an "active layer" 108. For the purposes of this discussion, an active layer is a device or structure capable of transforming electric energy to electromagnetic, e.g., light, energy. The position of the active layer 108 is such that it resides at an anti-node of a resonant electromagnetic wave where the generally spontaneous emissions of the active layer 108 can be used to best "energize" the RCLED device 100.

The exemplary active layer 108 includes a number of quantum wells formed by alternating layers of undoped InAs and InAsSb. Note that each undoped InAs layer is a cladding layer and each InAsSb is a quantum well. Note that for a quantum well having a $InAs_{(1-x)}Sb_x$ composition, adjusting value x allows one to get a desired wavelength. In the present situation, a quantum well having 11% of InSb and 89% of InAs can provide an ideal wavelength of 4.26 microns.

However, the particular form and composition of any resident quantum well can vary from embodiment to embodiment (with differing efficiency) as may be necessary or otherwise desired to achieve emission at different wavelengths necessary for the sensing of gases. For example, while the particular quantum wells are optimized for carbon dioxide ($CO_2$) having 11% of InSb and 89% of InAs, varying the ratios to about 13% of InSb and 87% of InAs ($InAs_{0.87}Sb_{0.13}$), can be used to produce quantum wells optimized to emit light at about 4.5 microns, which correlates to an absorption band for carbon monoxide (CO). Thus, the underlying methods and systems with little variation can be used for both fire detectors and CO detectors.

While a single quantum well can be sufficient to energize the RCLED device 100, a greater number of quantum wells might also be used. For the present embodiments, the inventor of the disclosed methods and systems has determined that, for reasons of cost and performance, the benefits for more than five quantum wells present a situation of diminishing returns, with three quantum wells provide a good balance of power production, overall performance and cost containment.

Directly below the active region 108 are three more contiguous layers 110-112 forming a "second chamber", with layer 110 being an undoped region of InAs (acting as a cladding layer), layer 111 being an "electron confining barrier layer", (which can be important to block electrons from diffusing into layer 112 and therefore increases the carrier density in the active region thus improving quantum well emission rate dramatically). In various embodiments, layer 112 can be similar to a tunnel-diode in that it can acts as second conductivity type (P-type) material in the RCLED device 100 but without blocking the current flow. Heavy doping of this layer 112 can insure that the device has low serial resistance.

For the RCLED device 100 of FIG. 1, the first chamber, the active region 108 and the second chamber can provide the "primary resonant path" of the RCLED device 100, i.e., the path that represents the minimum distance electromagnetic energy may need to travel (back and forth) within the device 100. For example, for an RCLED having a wavelength λ, a distance from the electrode/reflector 102 to the center of the active region 108 can be set to λ/2 while the distance from the center of the active region 108 to the top of the DBR stack 114 can be set to λ/4. The primary resonant path could then be defined as from the bottom of electrode 102 to the top of the DBR stack (a total of 3λ/4) and back again for a total distance of 1.5λ.

Returning to FIG. 1, like the top electrode 102, the DBR stack 114 can be considered a reflector. Generally, the amount of reflection provided by the electrode 102 and DBR stack 114 will affect the quality factor (or "Q") of the RCLED device 100. Given a particular fixed reflectivity of the electrode 102, the more DBR pairs, the higher the quality factor will be.

The DBR stack 114 can contain any number of alternating pairs of materials, such as doped InAs and doped GaSb, and have a thickness such that each layer represents a quarter wavelength of the desired RCLED output. Assuming refractivity coefficients of 3.5 and 3.9 for the alternating DBR materials, it can be shown that 8.5 DBR pairs can produce a total reflectivity of 53%, 12 DBR pairs can produce a total reflectivity of 74%, and so on. As quarter-wave DBR stacks are well understood in the art no further description will be provided as to the details except that need to provide clear context.

Again returning to FIG. 1, below the DBR stack 114 is a substrate that provides the base upon which the RCLED device 100 is constructed, and below the substrate 116 is a second electrode 118 that, along with the first electrode 102, can provide the basic current necessary to power the active region 108 of the RCLED device 100.

FIG. 2 depicts an exemplary sequence of layers within the RCLED device of FIG. 1. As shown in FIG. 2, the sequence of layers are numbered 1 through 15 and relate to the various regions 102-118 depicted in FIG. 1. For example, electrode layers 1 and 15 relate to electrodes 102 and 118 respectively, layers 2 and 3 relate to regions 104 and 106 respectively, layers 4-8 relate to region 108, layer 9 to region 110, layer 10 relates to region 111, layers 11-12 relate to region 112, layer 13 relates to region 114, and layer 14 relates to substrate 116.

While the particular materials, dopants and dimensions are derived of an actual working RCLED device capable of producing a 4.26 micron infrared emission, it should be appreciated that the particular materials, dopants and dimensions may vary from embodiment to embodiment. For example, in various embodiments the p-dopant in layer 2 might be replaced with an n-dopant of approximately the same concentration (and in such case the second conductivity type must be altered). Similarly, the thicknesses of layers 2 and 3 might vary substantially as long as their combined thickness remains the same.

Also depicted to the right of the various materials and thicknesses are the dimensions relative to the wavelength of the RCLED. For example, assuming a refractive index of 3.5, the distance from the bottom of layer 1 to the center of layer 6 is 608 nm ($=\lambda/2$), and the distance from the center of layer 6 to the top of the DBR stack (layer 13) is 304 nm ($=\lambda/4$). The resultant primary resonant path is then $2(\lambda/4+\lambda/2)=1.5\lambda$.

An advantage of having a short signal path within the RCLED is that, the shorter the distance electromagnetic energy travels within the RCLED, the less energy is likely to be re-absorbed within the various layers 2-12, and the short cavity length gives better spectral overlap between the resonant optical mode and quantum well emissions.

Another advantage of a short path is that the RCLED device is less likely to operate in a variety of different resonant modes. The absence of such parasitic modes, in turn, helps the RCLED device produce more output energy at the desired wavelength.

A final observation about FIG. 2 is that the second chamber (layers 9-12) include a tunneling diode structure (layers 11-12), which can in various embodiments be necessary for efficient function of the RCLED. Likewise, as discussed above layer 10, i.e., the electron confining barrier layer, can be important to block electrons from diffusing into layer 112 and therefore increases the carrier density in the active region thus improving quantum well emission rate dramatically.

Figure 3:
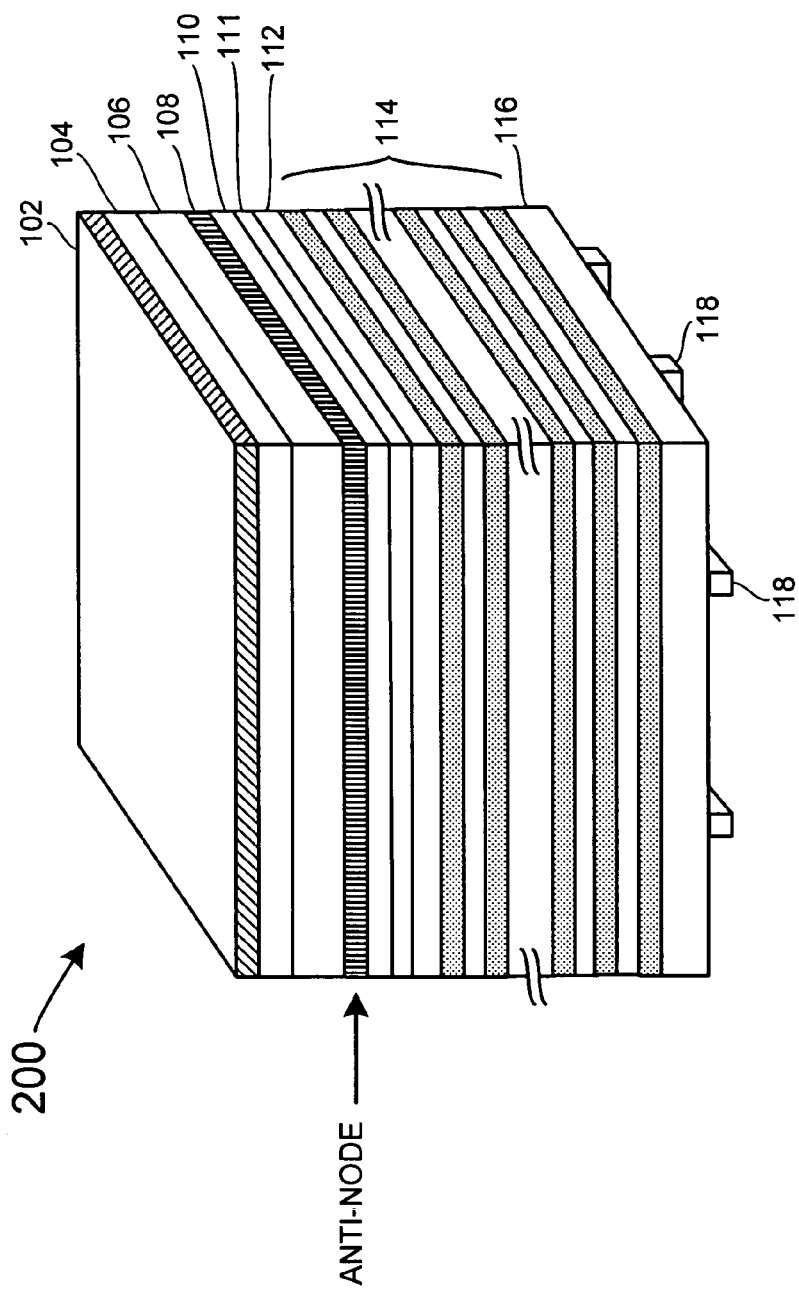
FIG. 3 is a second exemplary RCLED device

FIG. 3 is a second exemplary RCLED device 200 similar to the device 100 of FIG. 1, but configured to emit electromagnetic radiation from the bottom side of the device 200. As shown in FIG. 3, the device's top electrode 102 has no window. In this embodiment, electrode 102 can be composed of a layer of gold, which acts as an efficient reflector and a low resistance contact. While not specifically shown, the bottom electrode 128 can include the appropriate aperture, which can take any number of forms including those mentioned above with regard to the top electrode of FIG. 1.

In order to optimize power efficiency for device 200, it can be advantageous to reduce the thickness of the substrate 116 or even completely remove it. Polishing the exposed end of the substrate 128 can further reduce re-absorption of energy.

FIG. 4 depicts a first exemplary sequence of layers within the RCLED device shown in FIG. 3. As shown in FIG. 4, the sequence of layers are numbered 1 through 15 and relate to the various regions 102-128 depicted in FIG. 3. For example, electrode layers 1 and 15 relate to electrodes 102 and 118 respectively, layers 2 and 3 relate to regions 104 and 106 respectively, layers 4-9 relate to region 108 (or note that layer 9 may be considered part of region 110), layer 10 (electron confining barrier layer) relates to layer 111, layers 11-12 (tunneling diode) relate to regions 113, layer 13 relates to region 114 and layer 14 relates to substrate 116. As indicated to the right-hand side of FIG. 4, the total distance between the two reflectors (back of layer 1 and the DBR pairs 14) is 1.25λ, and thus the primary resonant path is twice that.

FIG. 5 depicts a second exemplary sequence of layers within the RCLED device of FIG. 3. As with FIG. 4, the sequence of layers in FIG. 5 are numbered 1 through 14 and relate to the various regions 102-128 depicted in FIG. 3. However, unlike the example of FIG. 4, the total distance between the two reflectors is now reduced to 0.5λ with the resultant primary resonant path reduced to a single wavelength λ.

As with the example of FIG. 2, the second chamber includes a tunneling diode structure (layers 10-12), which can in various embodiments be necessary for efficient function of the RCLED.

Figure 6:
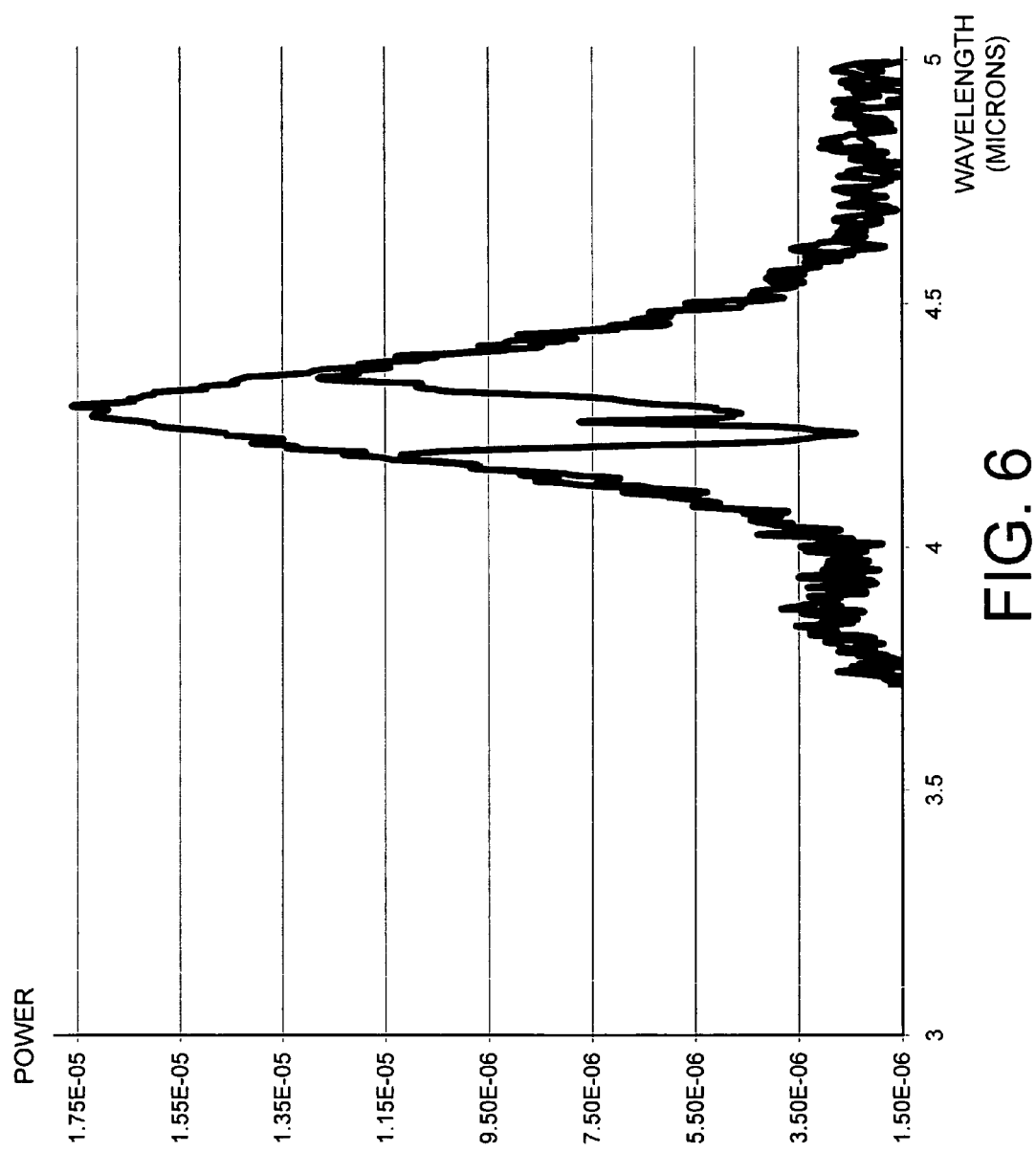
FIG. 6 depicts an exemplary profile of an RCLED electromagnetic output in a carbon-dioxide free atmosphere superimposed with an exemplary profile of the same electromagnetic output filtered through an atmosphere containing carbon dioxide.

FIG. 6 depicts an exemplary profile of an RCLED electromagnetic output in a carbon-dioxide free atmosphere superimposed with an exemplary profile of the same electromagnetic output filtered through an atmosphere containing carbon dioxide. As shown in FIG. 6, the spectrum of the unaffected RCLED output has a peak-like profile. As discussed above, the sharpness of this profile is an indication of the quality factor of the RCLED. Experiments and calculation suggest that, to produce an economic RCLED-based detector useful to detect small changes in carbon dioxide concentrations, a quality factor of about Q=21 appears to work well, although quality factors ranging from 14 to 28 may also provide adequate performance.

While greater quality factors might in theory provide for better carbon dioxide detectors, any increase in quality factor generally requires more DBR pairs, and thus increased costs. Furthermore, an excessive quality factor may not provide the best output profile of the RCLED, which should in reality match the absorption spectra of carbon dioxide at 4.26 microns to the extent possible.

Note carefully, however, that the carbon dioxide absorption profile actually has two "notches". It is possible using a high enough quality factor to match a single notch and ignore the second notch. In such situations, the example of FIG. 5 would be the best candidate to accomplish such an endeavor given the short primary resonant path and the high reflectivity of the top gold electrode (layer 1).

Figure 7:
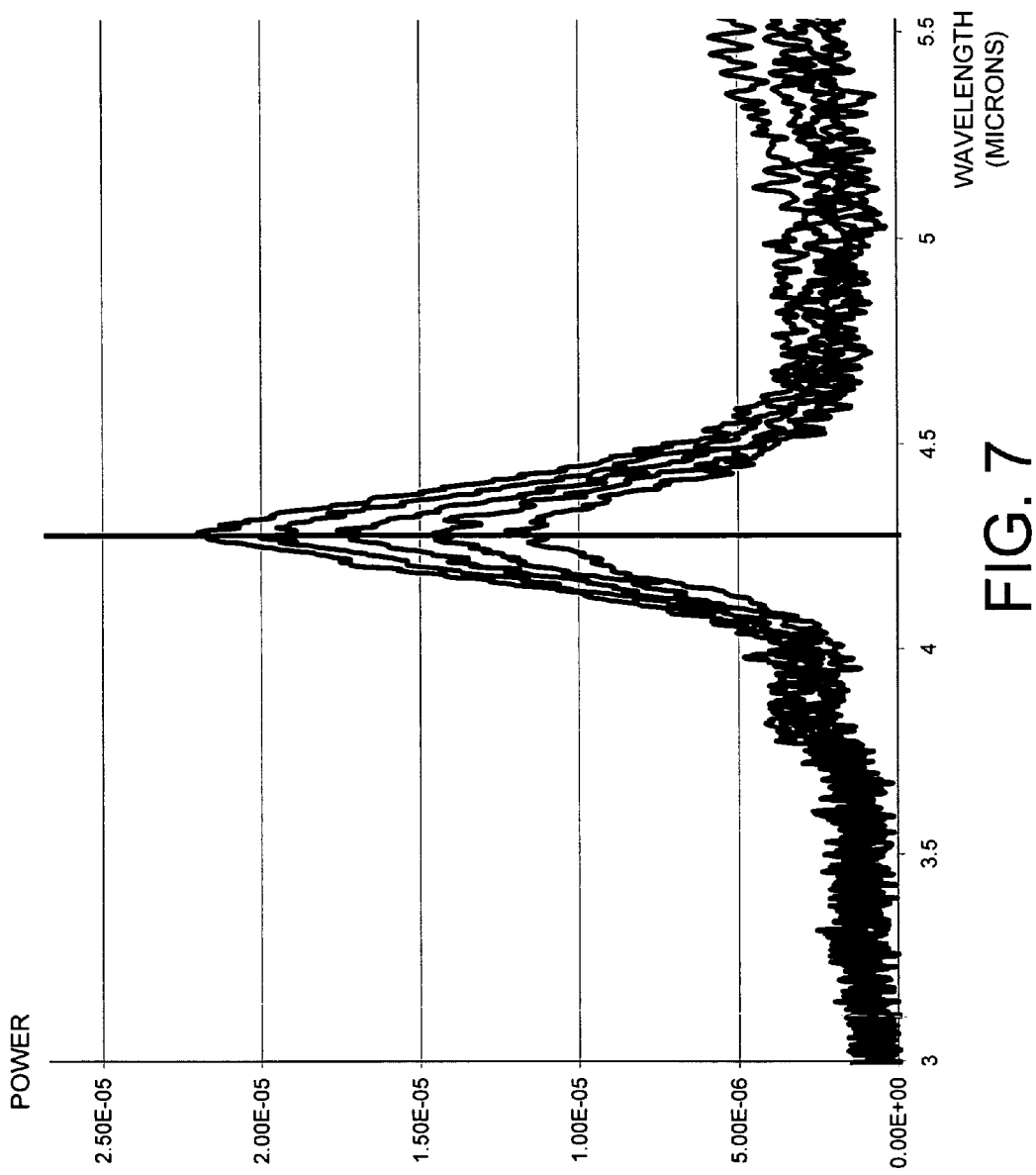
FIG. 7 depicts an exemplary family of output profiles of an RCLED for different drive currents ranging from 50 mA to 100 mA.

FIG. 7 depicts an exemplary family of output profiles of an RCLED for different drive currents ranging from 50 mA to 100 mA derived via experimental measurements. As shown in FIG. 7, the central wavelength for the family of profiles remains constant at about 4.26 microns. The main effect of the differing current levels appears to be limited to a near linear change in output energy, with only minor changes in overall output profile shape. While not shown in FIG. 7, experimentation of exemplary RCLED devices produced by the inventor also shows that the central wavelength is similarly unaffected by temperature variations.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A Resonant Cavity Light Emitting Diode (RCLED) device capable of emitting radiation having a peak-like profile with a central wavelength ($\lambda$), the device comprising:
a first active region having a planar form with a top side and bottom side and one or more quantum wells disposed within, wherein the one or more quantum wells are configured to provide energy to stimulate radiation output the RCLED and are located about an anti-node position for a resonant wave of the RCLED;
a first chamber adjacent to the top side of the first active region, wherein the first chamber has a thickness such that it extends a first distance from the middle of the first active region; and
a second chamber, adjacent to the bottom side of the first active region, including a cladding layer, an electron confining barrier layer, and a tunneling diode layer;
wherein the first active region, the first chamber and the second chamber form a primary resonant path that produces electromagnetic radiation with a center wavelength in the infrared region, and
wherein the total thickness of the first active region, the first chamber and the second chamber is about or less than $2\lambda$.

2. The device according to claim 1, wherein the first active region contains from one to five quantum wells.

3. The device according to claim 2, wherein the first active region contains three quantum wells.

4. The device according to claim 1, wherein the quantum wells consists of alternating layers of InAs and InAsSb.

5. The device according to claim 4, wherein each quantum well has an InAs(1-x)Sbx composition, with x being approximately 11%.

6. The device according to claim 4, wherein each quantum well has an InAs(1-x)Sbx composition, with x being approximately 13%.

7. The device according to claim 6, wherein the thickness of at least one the first chamber and the second chamber is about $0.5\lambda$.

8. The device according to claim 6, wherein the total thickness of the first active region, the first chamber and the second chamber is about $0.5\lambda$.

9. The device according to claim 1, further comprising a second reflector adjacent to the bottom of the second chamber, the second reflector including a quarter-wave Distributed Bragg Reflector (DBR) stack.

10. The device according to claim 9, wherein the second reflector includes from 8.5 to 17 DBR pairs.

11. The device according to claim 9, wherein the second reflector includes from 11 to 13 DBR pairs.

12. The device according to claim 10, wherein the second reflector includes alternating regions composed primarily of InAs and GaSb respectively.

13. The device according to claim 1, wherein the RCLED is configured to emit an infrared radiation having a central wavelength of approximately 4.26 microns in air.

14. The device according to claim 1, wherein the first reflector is configured to allow a substantial amount of radiation to pass beyond the first reflector.

15. The device according to claim 1, wherein the central wavelength and the quality factor of the RCLED are substantially optimized for use to detect carbon dioxide in an atmosphere.

16. The device according to claim 15, wherein the quality factor of the RCLED is substantially optimized for use to detect carbon dioxide in an atmosphere having a carbon dioxide concentration in a range of 100ppm to 1000ppm.

17. The device according to claim 16, wherein the quality factor of the RCLED is substantially optimized for use to detect carbon dioxide in an atmosphere having a carbon dioxide concentration in a range of 250ppm to 400ppm.

18. The device according to claim 15, wherein the quality factor of the RCLED is substantially optimized for use to detect one of two carbon dioxide absorption notches in the 4.26 micron region.

19. A Resonant Cavity Light Emitting Diode (RCLED) device capable of emitting radiation having a peak-like profile with a central wavelength ($\lambda$), the device comprising:
a first active region having one or more quantum wells disposed within, wherein the primary material used for the first chamber is InAs;
a first chamber and second chamber coupled to the first active region, wherein the second chamber includes a cladding layer, an electron confining barrier layer and a tunneling diode layer; and
a first and second reflectors coupled to the first and second chambers respectively.

20. The device according to claim 19, wherein the primary resonant path of radiation within the RCLED is about or less than $1.5\lambda$.

21. The device according to claim 19, wherein the primary resonant path of radiation within the RCLED is about $1.0\lambda$.

22. The device according to claim 19, wherein the RCLED is composed primarily of InAs and includes a number of epitaxially-grown internal layers.

23. A method for operating in a Resonant Cavity Light Emitting Diode (RCLED) device having a first active region having one or more quantum wells disposed within, a first chamber and a second chamber coupled to the first active region and a first reflector and a second reflector coupled to the first and second chambers respectively, wherein the second chamber includes a cladding layer, an electron confining barrier layer and a tunneling diode layer; the method comprising:
converting electric energy to emit electromagnetic energy into the RCLED using the quantum wells;

generating a resonant electromagnetic signal having a peak-like profile with a central wavelength of A within the RCLED using the emitted electromagnetic energy, wherein the resonant signal is generated using a primary resonant path formed from the first active region, the first chamber and the second chamber, and wherein the RCLED is composed of substantial amounts of InAs; and passing a portion of the electromagnetic energy beyond either the first or second reflector.

24. The method according to claim 23, wherein the central wavelength and the quality factor of the resonant signal is substantially optimized for use to detect carbon dioxide in a gaseous atmosphere.

25. The method according to claim 23, wherein the central wavelength and the quality factor of the resonant signal is substantially optimized for use to detect carbon monoxide in a gaseous atmosphere.

26. The method according to claim 23, wherein the primary resonant path of the RCLED is no more that $3\lambda$.

* * * * *